(12) United States Patent
Tsai et al.

(10) Patent No.: US 6,180,725 B1
(45) Date of Patent: Jan. 30, 2001

(54) RESIN COMPOSITIONS FOR ELECTRIC CIRCUIT BOARDS

(75) Inventors: Hsien-Yin Tsai, Tainan; In-Mau Chen, Chu-Pang; Wen-Faa Kuo, Hsinchu, all of (TW)

(73) Assignee: Industrial Technology Research Institute, Hsinchu (TW)

( * ) Notice: Under 35 U.S.C. 154(b), the term of this patent shall be extended for 0 days.

(21) Appl. No.: 09/363,874

(22) Filed: Jul. 29, 1999

(30) Foreign Application Priority Data

May 11, 1999 (TW) .................................................. 88107603

(51) Int. Cl.⁷ .................................................. C08F 283/06
(52) U.S. Cl. .......................... 525/404; 525/222; 525/227; 525/242; 525/244; 525/329.7; 525/333.3; 428/500; 524/81
(58) Field of Search .................................. 525/222, 227, 525/242, 244, 329.7, 333.3, 404; 428/500; 524/81

(56) References Cited

U.S. PATENT DOCUMENTS

| | | | |
|---|---|---|---|
| 4,530,914 | 7/1985 | Ewen et al. | 502/113 |
| 4,542,199 | 9/1985 | Kaminsky et al. | 526/160 |
| 4,665,047 | 5/1987 | Slaugh et al. | 502/108 |
| 4,752,597 | 6/1988 | Turner | 502/104 |
| 5,026,798 | 6/1991 | Canich | 526/127 |
| 5,162,445 | 11/1992 | Powers et al. | 525/333.4 |
| 5,272,236 | 12/1993 | Lai et al. | 526/348.5 |
| 5,543,484 | 8/1996 | Chung et al. | 526/347.1 |
| 5,548,029 | 8/1996 | Powers et al. | 525/195 |

FOREIGN PATENT DOCUMENTS 9-12746   1/1997 (JP) .................................. C08J/5/24

*Primary Examiner*—Samuel A. Acquah
(74) *Attorney, Agent, or Firm*—Darby & Darby

(57) ABSTRACT

A resin composition which increases the copper peeling strength and improves the dielectric properties of electric circuit boards is disclosed. The resin composition comprises: (a) 20–100 parts by weight of a syndiotactic polystyrene, (b) 1–40 parts by weight of a functionalized syndiotactic styrene-based copolymer having microfoaming when being cured, (c) 1–40 parts by weight of an epoxy-styrene copolymer, and (d) 0–40 parts by weight of an additive.

11 Claims, No Drawings

RESIN COMPOSITIONS FOR ELECTRIC CIRCUIT BOARDS

BACKGROUND OF THE INVENTION

1. Field of the Invention

The present invention relates to a resin composition constituting the laminate for electric circuits boards and a laminate comprising such a resin composition. More particularly, it relates to a resin composition for reducing the dielectric constant and increasing the peeling strength of electric circuit boards and a laminate comprising such a resin composition.

2. Description of the Related Arts

Syndiotactic polystyrene (sPS) has the properties of high melting point, low dielectric constant, low specific gravity, and excellent chemical resistance, which make it very useful in many applications. However, it suffers a major deficiency, that is, poor adhesion to other materials. In particular, its poor adhesion to copper foils makes it unsatisfactory for making electric circuit substrates even though it has more ideal dielectric properties than the epoxy resins and the cyanate resins used nowadays. In order to solve the above-mentioned problem, attempts have been made by incorporating an aminosilane coupling agent to improve the adhesive strength to copper foils. See for example, Japanese Patent Application Laid-Open No. 9012746. The coupling agent, however, generally deteriorates the dielectric properties of the substrates.

Accordingly, the invention aims to improve the adhesive strength of the electric circuit substrates to copper foils without deteriorating the dielectric properties.

DETAILED DESCRIPTION OF THE INVENTION

An object of the invention is to provide a resin composition constituting the laminate for an electric circuit board, which improves the peeling strength of copper foils from the electric circuit substrate as well as improves the dielectric properties of the substrates.

Another object of the invention is to provide a laminate for an electric circuit board comprising such a resin composition.

To attain the above objects, the resin composition in accordance with the present invention is incorporated with a functionalized syndiotactic styrene-based copolymer which has microfoaming when being cured. The functional group of the functionalized copolymer contributes to the enhancement of the adhesivity to copper foils, while its microfoaming contributes to the decrease of the dielectric constant.

The resin composition according to the present invention comprises: (a) 20–100 parts by weight of a syndiotactic polystyrene, (b) 1–40 parts by weight of a functionalized syndiotactic styrene-based copolymer having microfoaming when being cured, (c) 1–40 parts by weight of an epoxy-styrene copolymer, and (d) 0–40 parts by weight of an additive.

In the resin composition according to the present invention, a syndiotactic polystyrene having a syndiotacticity of over 90% is preferably used as the component (a), which is typically prepared by using a metallocene catalyst. The molecular weight of the syndiotactic polystyrene to be used in the present invention is not specifically limited, but is preferably within the range of $1 \times 10^5$ to $5 \times 10^5$ in terms of weight-average molecular weight.

In the resin composition according to the present invention, a functionalized syndiotactic styrene-based copolymer having microfoaming when being cured is employed as the component (b). Especially preferred are functionalized syndiotactic styrene/para-alkylstyrene copolymers. Illustrative of such copolymers include oxidized styrene/para-methylstyrene copolymer, halogenated syndiotactic styrene/para-methylstyrene copolymer, carboxylated styrene/para-methylstyrene copolymer, metallized styrene/para-methylstyrene copolymer, aminated styrene/para-methylstyrene copolymer, and silylated styrene/para-methylstyrene copolymer. The molecular weight of the functionalized syndiotactic styrene-based copolymer to be used in the present invention is preferably within the range of $3 \times 10^3$ to $2 \times 10^5$ in terms of weight-average molecular weight.

The general process for preparing the functionalized syndiotactic styrene-based copolymer of the present invention will be described below.

Taking the reaction of styrene and para-methylstyrene monomers as an example, the two monomers are copolymerized by using a metallocene catalyst. The catalyst system may also include an activating cocatalyst such as methyl aluminoxane (MAO).

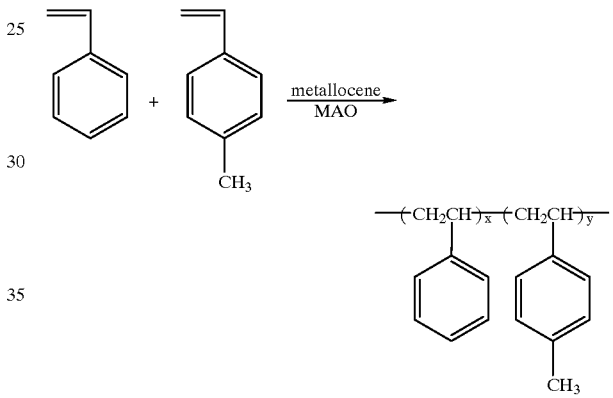

wherein x and y are the molar ratio of the respective monomer, and x+y=100.

Suitable metallocene catalysts have a delocalized π-bonded moiety with a constrained geometry. The catalysts may be further described as a metal coordination complex comprising a IVB-VIB Groups metal and a delocalized π-bonded moiety with a constrained geometry. In this regard, references are made to U.S. Pat. Nos. 4,542,199; 4,530,914; 4,665,047; 4,752,597; 5,026,798; and 5,272,236. Preferred catalyst complexes include zirconocene and titanocene coordination compounds with single or double cyclopentadienyl derivatives which form the constrained ligand geometry.

The activating cocatalyst can be methyl aluminoxane (MAO), a trialkyl aluminum, a dialkyl aluminum, a salt of an inert and non-coordinating anion, or a mixture thereof. Illustrative of trialkyl aluminum includes trimethyl aluminum, triethyl aluminum, tripropyl aluminum, trisopropyl aluminum, tributyl aluminum, and triisobutyl aluminum (TIBA). The salt of an inert and non-coordinating anion can be borates. Borates suitable for use in the present invention include N,N-dimethyl anilinium tetrakis(pentafluorophenyl) borate, triphenyl carbenium tetrakis(pentafluorophenyl) borate, trimethyl ammonium tetrakis(pentafluorophenyl) borate, ferrocenium tetrakis(pentafluorophenyl)borate, dimethyl ferrocenium tetrakis(pentafluorophenyl)borate, and silver tetrakis(pentafluorophenyl)borate. Preferably, the activating cocatalyst is methyl aluminoxane, or a mixture of a trialkyl aluminum and a borate. Suitable diluents for the polymerization reaction include aliphatic and aromatic hydrocarbons such as propane, butane, pentane, cyclopentane, hexane, toluene, heptane, isooctane, and the like, which can be used individually or collectively.

In general, the polymerization reaction is carried out by mixing styrene and p-methylstyrene in the presence of the catalyst in a copolymerization reactor, with thorough mixing at a temperature between 0° C. to 100° C. The polymerization is carried out under an inert gas atmosphere in absence of moisture.

In the styrene/p-methylstyrene copolymer, the benzylic protons in p-methylstyrene unit can be easily converted to various functional groups, such as —COOH, —OH, —NH$_2$, —Cl, —Br, —M, COOM (M=metal, e.g. Li, Na, K and Ca), under mild reaction conditions. Most functionalization reactions of benzylic protons in organic compounds can be applied to those of benzylic protons in p-methylstyrene. With regard to the functionallization of benzylic protons, references are made to U.S. Pat. No. 5,543,484 (Chung, et al.); U.S. Pat. No. 5,548,029 (Powers et al.); and U.S. Pat. No. 5,162,445 (Powers, et al.)

In the resin composition according to the present invention, an epoxy/styrene copolymer is employed as the component (c). A particularly preferred epoxy/styrene copolymer is glycidyl methacrylate/styrene copolymer with a melt index ranging from 0.01 to 30. The molar content of glycidyl methacrylate (GMA) to styrene in the copolymer may ranges from 1/99 to 50/50.

The component (d), that is, the additives to be used herein are typically flame retardants, flame retardant aids, crystallizing agents, crystallizing aid agents, or combinations thereof.

According to another aspect of the invention, there is also provided a laminate for a printed circuit board, which comprises a sheet made from the resin composition as set forth above being laminated with a glass cloth and a copper foil. The glass cloth may preferably be impregnated with the functionalized syndiotactic styrene-based copolymer or the epoxy/styrene copolymer as set forth above. It is more preferable that the copper foil is coated with the functionalized syndiotactic styrene-based copolymer or the epoxy/styrene copolymer as set forth above to impart a greater adhesivity to the laminate. A variety of methods are available for the production of the laminate of the invention. For example, the aforesaid three elements can be charged in a mold and subject to compression molding at a temperature ranging from 230° C. to 320° C. to form a copper laminated product for use in electric circuit boards.

According to a preferred embodiment of the invention, the laminate produced thereby exhibited an excellent copper peeling strength of 5.7 lb/in and a low dielectric constant of 2.6 at 1 GHz.

Without intending to limit it in any manner, the present invention will be further illustrated by the following examples.

PREPARATION EXAMPLE (1) Synthesis of syndiotactic poly(styrene-co-p-methylstyrene)

35 mL of the purified para-methylstyrene monomer (hereafter referred to as "pMS") and 315 mL of the purified styrene monomer (hereafter referred to as "SM") were charged in 1 L metal reaction vessel under nitrogen atmosphere. Then, 2.8 mL of 10 wt % methyl aluminoxane (MAO) was charged in the reaction vessel. The reaction vessel was heated to 70° C., followed by addition of 0.0208 mmol of pentamethylcyclopentadienyl dimethoxy titanium (III) [Cp*Ti(OMe)$_2$]. The reaction was allowed to proceed for 60 minutes before terminated by a sodium hydroxide/methanol solution. The resultant mixture was extracted with methanol by the Soxhlet extraction method to afford 86 g of syndiotactic poly(styrene-co-p-methylstyrene). The compositional proportion and the melting point of the copolymer were determined by $^1$H NMR and differential scanning calorimetry (DSC), respectively. The proportion of pMS in the copolymer was about 17 mol %. The melting point was 232° C.

(2) Functionalization of syndiotactic poly(styrene-co-p-methylstyrene) (sPS-pMS)

In a reaction flask, 20 g of the syndiotactic poly(styrene-co-p-methylstyrene) (sPS-pMS) was dissolved in 600 mL of o-dichlorobenzene (ODCB) under an oil bath at 120° C. To the reaction flask was gradually added 300 mL of acetic acid. After cooling the mixture to about 100° C., 10 mole % of cobalt (III) acetate tetrahydrate and 40 mole % of sodium bromide, based on the pMS content of sPS-pMS, were added, and oxygen was bubbled through the mixture at a rate of 1 L/min for 1.5 hours. After cooling, the reaction was terminated with methanol. The resultant mixture was filtered, washed with hot water/methanol twice and methanol twice, extracted with methanol by the Soxhlet extraction method for 20 hours, and dried to afford the oxidized sPS-pMS. Both —COOH and —CHO groups were observed with the oxidized sPS-pMS by $^1$H NMR spectrum, which indicated the repeating units of para-carboxylstyrene and para-formylstyprene, respectively. The total oxidation, that is, the mol % of the oxidized functional group based on the moles of the original polymer (sPS-pMS) was 3.32.

EXAMPLE 1

(1) Preparation of sPS Composite 90 parts by weight of sPS, 2 parts by weight of the oxidized sPS-pMS in Preparation Example (functional group content=3.3 mol %), 6 parts by weight of glycidyl methacrylate/styrene copolymer (GMA/styrene molar ratio=5/95), and two parts by weight of and a crystallizing agent and a crystallizing aid agent as additives were dry blended and melt kneaded in an extruder at a revolution of 60 rpm at a temperature of 280° C. The resulting blend was cooled and pelletized. Then the pellets were molded into a sheet.

(2) Coating of Copper Foil

A copper foil was coated by a toluene solution containing 0.05 g/ml of the oxidized SPS-pMS in Preparation Example which had a functional group content of 3.3 mol %.

(3) Preparation of Prepreg

A prepreg was prepared by impregnating a glass cloth for 5 minutes with a toluene solution containing 0.3 g/ml of the oxidized sPS-pMS in Preparation Example. The impregnated glass cloth was planarized with a glass rod before the solution was dried.

(4) Production of Laminate

The composite sheet, the copper foil, and the prepreg obtained in the foregoing were charged in a mold and subjected to compressing molding at 270° C. under a pressure of 40 kg/cm$^2$ for 2 minutes. The laminate thus obtained was measured for the dielectric properties and the peeling strength of the copper foil from the laminate. The results of the measurements are shown in Table 1.

EXAMPLE 2

The procedure outlined in Example 1 was repeated except that the toluene solution used for coating the copper foil was changed to a toluene solution containing 0.05 g/ml of an oxidized sPS-pMS having a functional group content of 6.1 mol %. The dielectric properties and the copper peeling strength of the laminate are listed in Table 1.

EXAMPLE 3

The procedure outlined in Example 1 was repeated except that the toluene solution used for coating the copper foil was changed to a toluene solution containing 0.1 g/ml of the oxidized sPS-pMS in Preparation Example which had a functional group content of 3.3 mol %. The dielectric properties and the copper peeling strength of the laminate are listed in Table 1.

EXAMPLE 4

The procedure outlined in Example 1 was repeated except that the toluene solution used for coating the copper foil was changed to a toluene solution containing 0.1 g/ml of an oxidized sPS-pMS having a functional group content of 6.1 mol %. The dielectric properties and the copper peeling strength of the laminate are listed in Table 1.

EXAMPLE 5

The procedure outlined in Example 1 was repeated except that the toluene solution used for impregnating the glass cloth was changed to a toluene solution containing 0.1 g/ml of GMA/styrene copolymer. The dielectric properties and the copper peeling strength of the laminate are listed in Table 1.

EXAMPLE 6

The procedure outlined in Example 1 was repeated except that the toluene solution used for coating the copper foil was changed to a toluene solution containing 0.3 g/ml of GMA/styrene copolymer (GMA/styrene molar ratio=15/85). The dielectric properties and the copper peeling strength of the laminate are listed in Table 1.

Comparative Example

A sheet made of pure sPS, a untreated copper foil, and a untreated glass cloth were laminated under the same conditions as described in Example 1. The dielectric properties and the copper peeling strength of the laminate are listed in Table 1.

As can be seen from Table 1, the laminates of the present invention (Examples 1–5) were improved in terms of both dielectric properties and copper peeling strength as compared to that of Comparative example. Specifically, the peeling strength was increased by 1.4–3 lb/in and the dielectric constant was decreased by 0.3–0.4.0

While the invention has been particularly shown and described with the reference to the preferred embodiment thereof, it will be understood by those skilled in the art that various changes in form and details may be made without departing from the spirit and scope of the invention.

What is claimed is:

1. A resin composition for electric circuit boards, comprising:
    (a) 20–100 parts by weight of a syndiotactic polystyrene;
    (b) 1–40 parts by weight of a functionalized syndiotactic styrene-based copolymer having microfoaming when being cured;
    (c) 1–40 parts by weight of an epoxy-styrene copolymer; and
    (d) 0–40 parts by weight of an additive.

2. The resin composition as claimed in claim 1, wherein said syndiotactic polystyrene has a weight-average molecular weight ranging from $1 \times 10^5$ to $5 \times 10^5$.

3. The resin composition as claimed in claim 1, wherein said functionalized syndiotactic styrene-based copolymer has a weight-average molecular weight ranging from $3 \times 10^3$ to $2 \times 10^5$.

4. The resin composition as claimed in claim 1, wherein said functionalized syndiotactic styrene-based copolymer is a functionalized syndiotactic styrene/para-alkylstyrene copolymer.

5. The resin composition as claimed in claim 4, wherein said functionalized syndiotactic styrene-based copolymer is a functionalized syndiotactic styrene/para-methylstyrene copolymer.

6. The resin composition as claimed in claim 5, wherein said functionalized syndiotactic styrene-based copolymer is an oxidized, halogenated, carboxylated, metallized, aminated, or silylated syndiotactic styrene/para-methylstyrene copolymer.

7. The resin composition as claimed in claim 6, wherein said functionalized syndiotactic styrene-based copolymer is an oxidized syndiotactic styrene/para-methylstyrene copolymer which has repeating units of para-carboxylstyrene and para-formylstyprene.

TABLE 1

| Example | Dk[*1] (500 MHz) | Dk (1.0 GHz) | Dk (1.5 GHz) | Df[*2] (500 MHz) | Df (1.0 GHz) | Df (1.5 GHz) | Copper peeling strength (lb/in) |
|---|---|---|---|---|---|---|---|
| 1 | 2.6 | 2.6 | 2.6 | — | — | — | 5.70 |
| 2 | 2.6 | 2.6 | 2.6 | — | — | — | 4.19 |
| 3 | 2.6 | 2.6 | 2.6 | — | $1 \times 10^{-3}$ | — | 4.10 |
| 4 | 2.6 | 2.6 | 2.6 | $2 \times 10^{-3}$ | $2 \times 10^{-3}$ | $1 \times 10^{-3}$ | 4.13 |
| 5 | 2.7 | 2.7 | 2.7 | $3 \times 10^{-3}$ | $1 \times 10^{-3}$ | — | 4.28 |
| 6 | 2.6 | 2.6 | 2.6 | $2 \times 10^{-3}$ | $1 \times 10^{-3}$ | $1 \times 10^{-3}$ | 5.53 |
| Comparative example | — | 3.0 | — | — | — | — | 2.70 |

[*1]Dk: dielectric constant
[*2]Df: dissipation factor

8. The resin composition as claimed in claim 1, wherein said epoxy-styrene copolymer is glycidyl methacrylate/styrene copolymer.

9. The resin composition as claimed in claim 8, wherein the molar ratio of glycidyl methacrylate to styrene in said glycidyl methacrylate/styrene copolymer is in the range of 1/99 to 50/50.

10. The resin composition as claimed in claim 1, wherein said glycidyl methacrylate/styrene copolymer has a melt index ranging from 0.01 to 30.

11. The resin composition as claimed in claim 1, wherein said additive is selected from the group consisting of flame retardants, flame retardant aids, crystallizing agents, crystallizing aid agents, and combinations thereof.

* * * * *